(12) United States Patent
Aritome

(10) Patent No.: US 8,891,306 B2
(45) Date of Patent: Nov. 18, 2014

(54) SEMICONDUCTOR MEMORY DEVICE

(71) Applicant: SK Hynix Inc., Icheon-si (KR)

(72) Inventor: Seiichi Aritome, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 132 days.

(21) Appl. No.: 13/832,717

(22) Filed: Mar. 15, 2013

(65) Prior Publication Data

US 2014/0189257 A1 Jul. 3, 2014

(30) Foreign Application Priority Data

Jan. 2, 2013 (KR) .................... 10-2013-0000207

(51) Int. Cl.
*G11C 11/34* (2006.01)
*G06F 12/00* (2006.01)

(52) U.S. Cl.
CPC ..................... *G06F 12/00* (2013.01)
USPC .............. 365/185.11; 365/185.2; 365/185.23; 365/51; 365/185.05; 365/185.06; 365/185.13; 365/185.17

(58) Field of Classification Search
USPC ......... 365/185.2, 185.23, 185.11, 51, 185.05, 365/185.06, 185.13, 185.17
See application file for complete search history.

(56) References Cited

U.S. PATENT DOCUMENTS

| 8,817,512 B2 * | 8/2014 | Kono ............................. 365/51 |
| 8,817,538 B2 * | 8/2014 | Itagaki et al. ............ 365/185.11 |
| 8,824,212 B2 * | 9/2014 | Lue .......................... 365/185.23 |
| 8,830,757 B2 * | 9/2014 | Kito .......................... 365/185.2 |
| 2010/0117143 A1 * | 5/2010 | Lee et al. ....................... 257/329 |

FOREIGN PATENT DOCUMENTS

KR 1020100052597 A 5/2010

OTHER PUBLICATIONS

Seiichi Aritome, "Scaling Challenges beyond 1xnm DRAM and NAND Flash," Joint Rump at VLSI Symposium, Jun. 12, 2012, pp. 24, Honolulu, HI.

* cited by examiner

*Primary Examiner* — Fernando Hidalgo
(74) *Attorney, Agent, or Firm* — William Park & Associates Patent Ltd.

(57) ABSTRACT

A semiconductor memory device includes stacked memory strings in which at least some adjacent memory strings share a common source line. During a read operation for a selected memory string, a first current path is formed from a bit line of the selected memory string to the common source line through the selected memory string. A second current path is formed from the bit line of the selected memory string, through the common source line, to a bit line of an adjacent unselected memory string. This reduced path resistance enhances device reliability in read mode.

20 Claims, 10 Drawing Sheets

SEMICONDUCTOR MEMORY DEVICE

CROSS-REFERENCE TO RELATED APPLICATION

This application claims priority from Korean Patent Application No. 10-2013-0000207, filed on Jan. 2, 2013, the contents of which are incorporated herein by reference in its entirety.

BACKGROUND

1. Technical Field

The present invention relates generally to a semiconductor memory device, and more particularly to a semiconductor memory device including memory cells stacked in a direction perpendicular to a substrate.

2. Related Art

One possible way to increase data storage capacity in a semiconductor memory device is to provide a larger number of memory cells within a predetermined area. The number of memory cells may be increased by reducing memory cell size, but there are limitations in memory cell size reduction.

SUMMARY

A semiconductor memory device having improved operating characteristics is described below in conjunction with example embodiments in accordance with the present invention.

A semiconductor memory device according to an embodiment of the present invention includes a memory array including memory blocks stacked in a plurality of layers over a substrate, wherein memory strings included in memory blocks of an odd-numbered layer and memory strings included in memory blocks of an even-numbered layer share bit lines or a common source line, and an operation circuit configured to supply operating voltages to the memory blocks for a data input/output operation of a selected memory string, wherein the operation circuit is configured to turn on semiconductor devices of an unselected memory string located above or below the selected memory string and sharing the common source line with the selected memory string during a read operation of the selected memory string.

A semiconductor memory device according to another embodiment of the present invention includes stacked memory strings in which at least some adjacent memory strings share bit lines or a common source line, and a current path provided from the common source line to a bit line of an unselected memory string during a read operation of a selected memory string.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, embodiments of the present invention will be explained in more detail with reference to the accompanying drawings. Although the present invention is described with reference to a number of example embodiments thereof, it should be understood that numerous other modifications and variations can be devised by those skilled in the art that will fall within the spirit and scope of the invention. The present invention may be embodied in different forms and should not be construed as limited to the embodiments set forth herein.

Another method for increasing the number of memory cells in a semiconductor device is to provide a three-dimensional (3D) structured memory block (or memory string) where memory cells are stacked in a direction perpendicular to a semiconductor substrate. This 3D structured memory string may include a vertical channel formed of silicon. The vertical channel may be formed between a bit line and a common source line.

In a 3D structured memory block, resistance of a common source line may reduce the reliability of a read operation. For example, during a read operation, the amount of current flowing through a vertical channel may be reduced due to high resistance of the common source line, and a voltage at the common source line may be increased to cause failure, which is one of the phenomena occurring when a voltage precharged to a bit line is not sufficiently discharged through the common source line.

Figure 1:
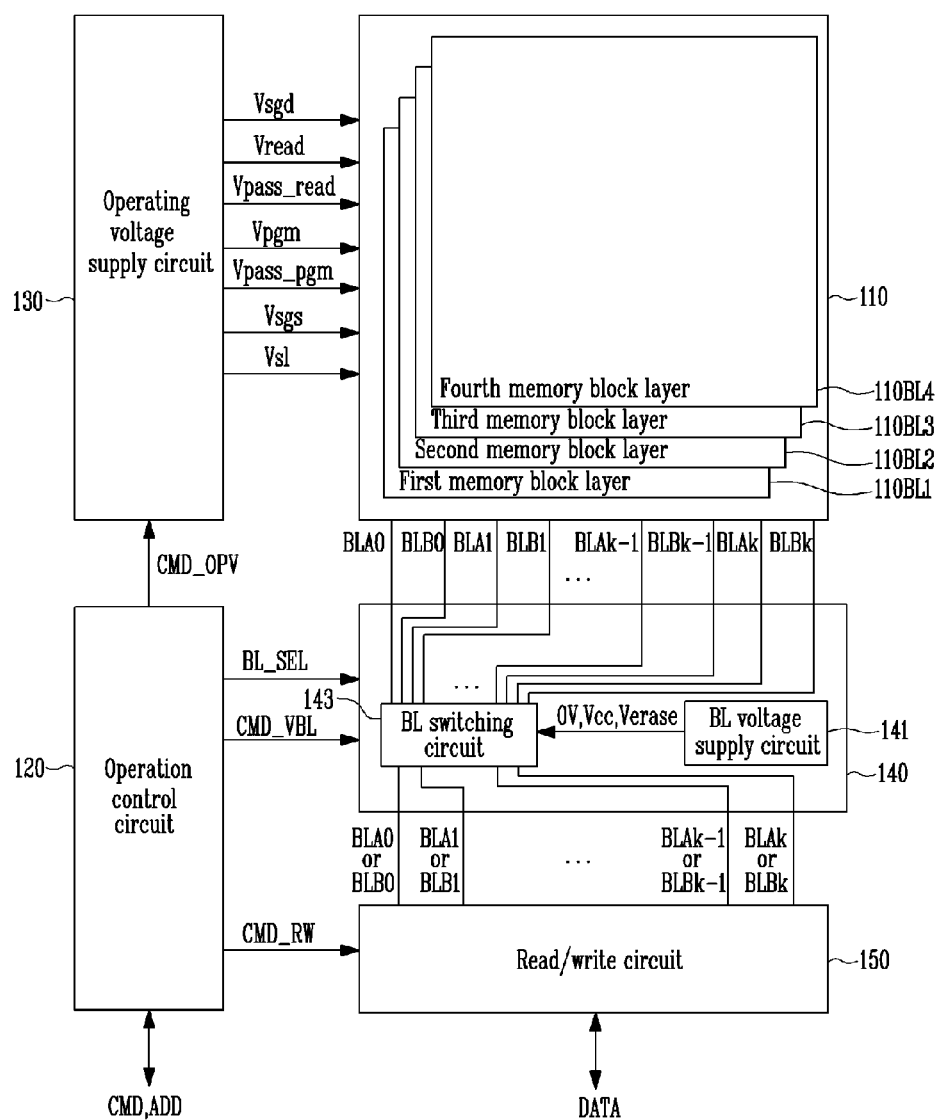
FIG. 1 is a block diagram of a semiconductor memory device according to an embodiment of the present invention.

Referring to FIG. 1, a semiconductor memory device may include a memory array 110 and peripheral circuits 120 to 150. The peripheral circuits 120 to 150 may include an operation control circuit 120 and operation circuits 130 to 150.

The memory array 110 may include a plurality of memory block layers 110BL1 to 110BL4 that are stacked over a substrate. Each memory block layer may include memory blocks that are arranged in a horizontal direction. Each memory block may include memory strings that are coupled between bit lines and a source line. A structure of each memory string is described below in detail.

Figure 2:
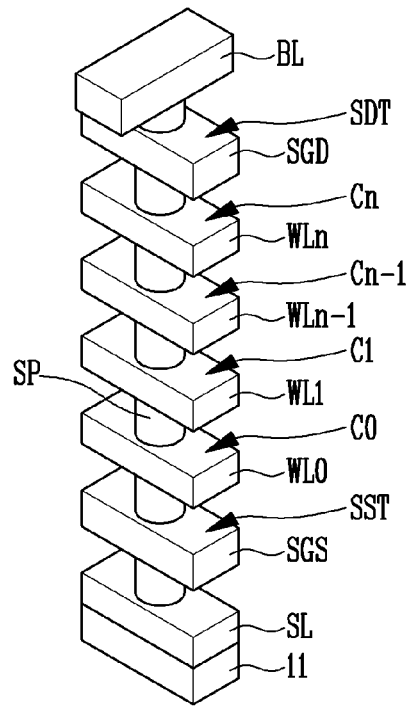
FIG. 2 is a three-dimensional view of a memory string included in a memory array of FIG. 1.
Figure 3:
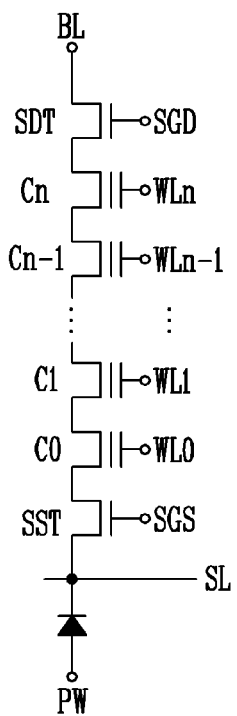
FIG. 3 is a circuit diagram of the memory string included in the memory array of FIG. 1.

FIG. 2 is a three-dimensional view of a memory string included in a memory array of FIG. 1. FIG. 3 is a circuit diagram of a memory string included in the memory array of FIG. 1.

Referring to FIGS. 2 and 3, a source line SL may be formed over a semiconductor substrate in which a well (e.g., P well) (PW) is formed. A vertical channel layer SP may be formed on the source line SL. A bit line BL may be coupled to a top surface of the vertical channel layer SP. The vertical channel layer SP may be formed of polysilicon. A plurality of conductive layers SGS, WL0 to WLn and SGD may surround the vertical channel layer SP at different heights. A multilayer (not illustrated) including a charge storage layer may be formed on a surface of the vertical channel layer SP. The multilayer may also be disposed between the vertical channel layer SP and the conductive layers SGS, WL0 to WLn and SGD.

The lowermost conductive layer may be a source selection line SGS, and the uppermost conductive layer may be a drain selection line SGD. The conductive layers between the source and drain selection lines SGS and SGD may be word lines WL0 to WLn. In other words, the plurality of conductive layers SGS, WL0 to WLn and SGD disposed at different levels may be formed over the semiconductor substrate, and the vertical channel layer SP passing through the conductive layers SGS, WL0 to WLn and SGD may be vertically coupled between the bit line BL and the source line SL formed over the semiconductor substrate.

A drain select transistor SDT may be formed at a position where the uppermost conductive layer SGD surrounds the vertical channel layer SP, and a source select transistor SST may be formed at a position where the lowermost conductive layer SGS surrounds the vertical channel layer SP. Memory cells C0 to Cn may be formed at positions where intermediate conductive layers WL0 to WLn surround the vertical channel layer SP.

The memory string having the above-described structure may include the source select transistor SST, the memory cells C0 to Cn and the drain select transistor SDT that are coupled in a direction perpendicular to the substrate between the source line SL and the bit line BL.

Figure 4:
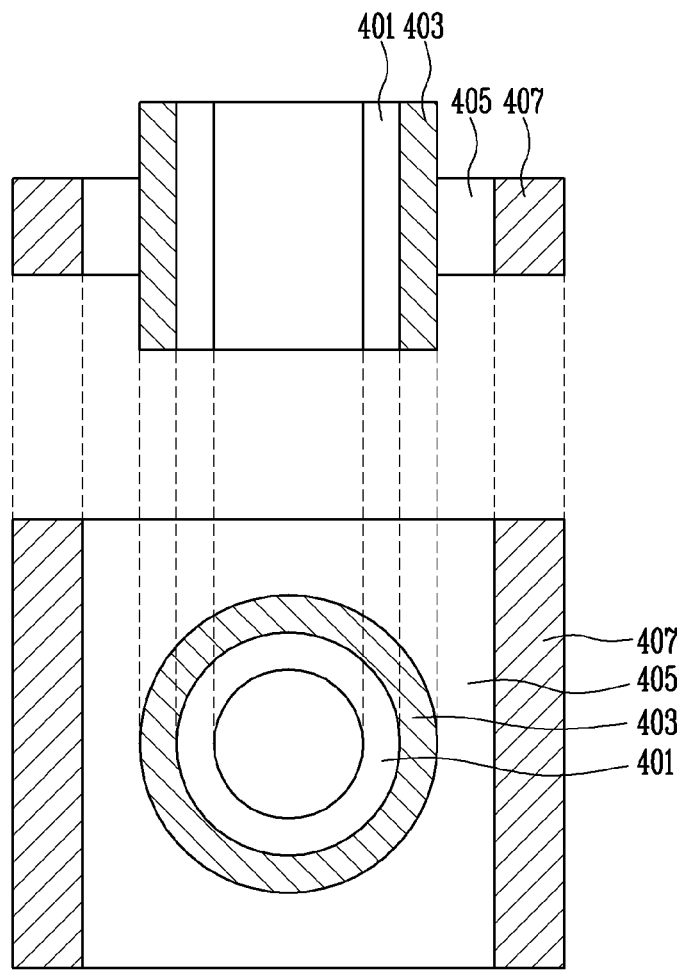
FIG. 4 is a view of a planar structure and a cross-sectional structure of a memory cell of the memory string of FIG. 2.

FIG. 4 illustrates a pipe channel layer 401 that may have a hollow cylindrical shape. The pipe channel layer 401 may include a semiconductor layer. The pipe channel layer 401 may include a polysilicon layer doped with such impurities (e.g., 5-valence impurities) that the pipe channel layer 401 may not have conductivity, or a polysilicon layer doped with no impurities. A stacked layer 403 including a charge storage layer may encircle the pipe channel layer 401. The stacked layer 403 may have a stacked structure of a tunnel insulating layer, a charge storage layer and a blocking insulating layer.

The tunnel insulating layer may include an oxide layer, the charge storage layer may include a nitride layer, and the blocking insulating layer may include an oxide layer or a high-k dielectric insulating layer with a higher dielectric constant than a nitride layer. A tunnel insulating layer may be located between the charge storage layer and the pipe channel layer 401. The conductive layers may surround the pipe channel layer 401 at different heights. For example, a conductive layer configured as a word line may include a polysilicon layer 405, and an outer wall of the conductive layer may include metal silicide 407. The stacked layer 403 may be located between the pipe channel layer 401 and the word line (405 and 407).

Figure 5:
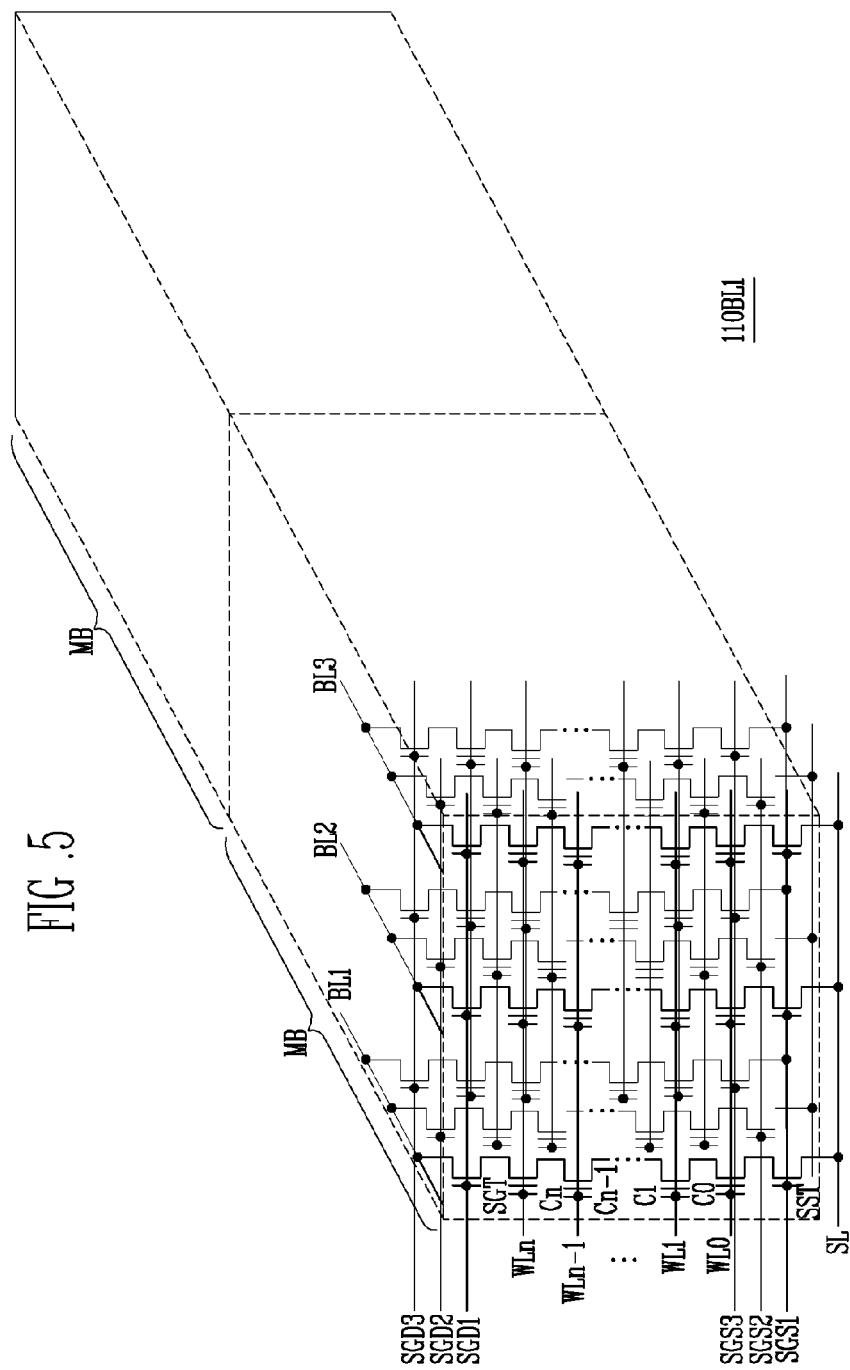
FIG. 5 is a circuit diagram of a memory block layer included in the memory array of FIG. 1.

FIG. 5 depicts a memory block layer 110BL1 that may include a plurality of memory blocks MB that are arranged in a direction horizontal to the substrate. Here, two memory blocks MB are depicted for illustration purposes. Each memory block MB may include memory strings coupled between bit lines and a common source line SL. Here, three bit lines BL1 to BL3 are depicted for illustration purposes. The memory blocks MB in the memory block layer 110BL1 may share the bit lines BL1 to BL3, while common source lines SL of the memory blocks MB may be separated from each other. The bit lines BL1 to BL3 may extend in a direction parallel to the horizontal direction in which the memory blocks MB are arranged.

A plurality of memory strings may be coupled to every bit line in each memory block MB. For example, a single memory string may include a first selection transistor (or source selection transistor) SST coupled to the common source line SL, a second selection transistor (or drain selection transistor) (SGT) coupled to the bit line BL1 and memory cells C0 to Cn vertically coupled in series between the first and second selection transistors SST and SGT.

In the memory block MB, source selection lines of the source selection transistors SST of the memory strings coupled in common to the common source line SL may be coupled to each other. Here, three source selection lines SGS1 to SGS3 are depicted for illustration purposes. The source selection lines SGS1 to SGS3 may be operated with substantially the same operating voltage. The source selection lines SGS1 to SGS3 may be coupled to each other in the memory block MB and separated from source selection lines of another memory block adjacent in the horizontal direction.

In addition, in the memory block MB, drain selection lines SGD1 to SGD3 of drain selection transistors SGT of the memory strings coupled in common to the bit line BL1 may be separated from each other and may be independently operated at different operating voltages. The drain selection lines SGD1 to SGD3 may extend in a direction crossing the bit lines BL1 to BL3. In addition, in the memory block MB, word lines of memory cells formed on the same layer and adjacent to each other in the horizontal direction may be coupled to each other.

Figure 6:
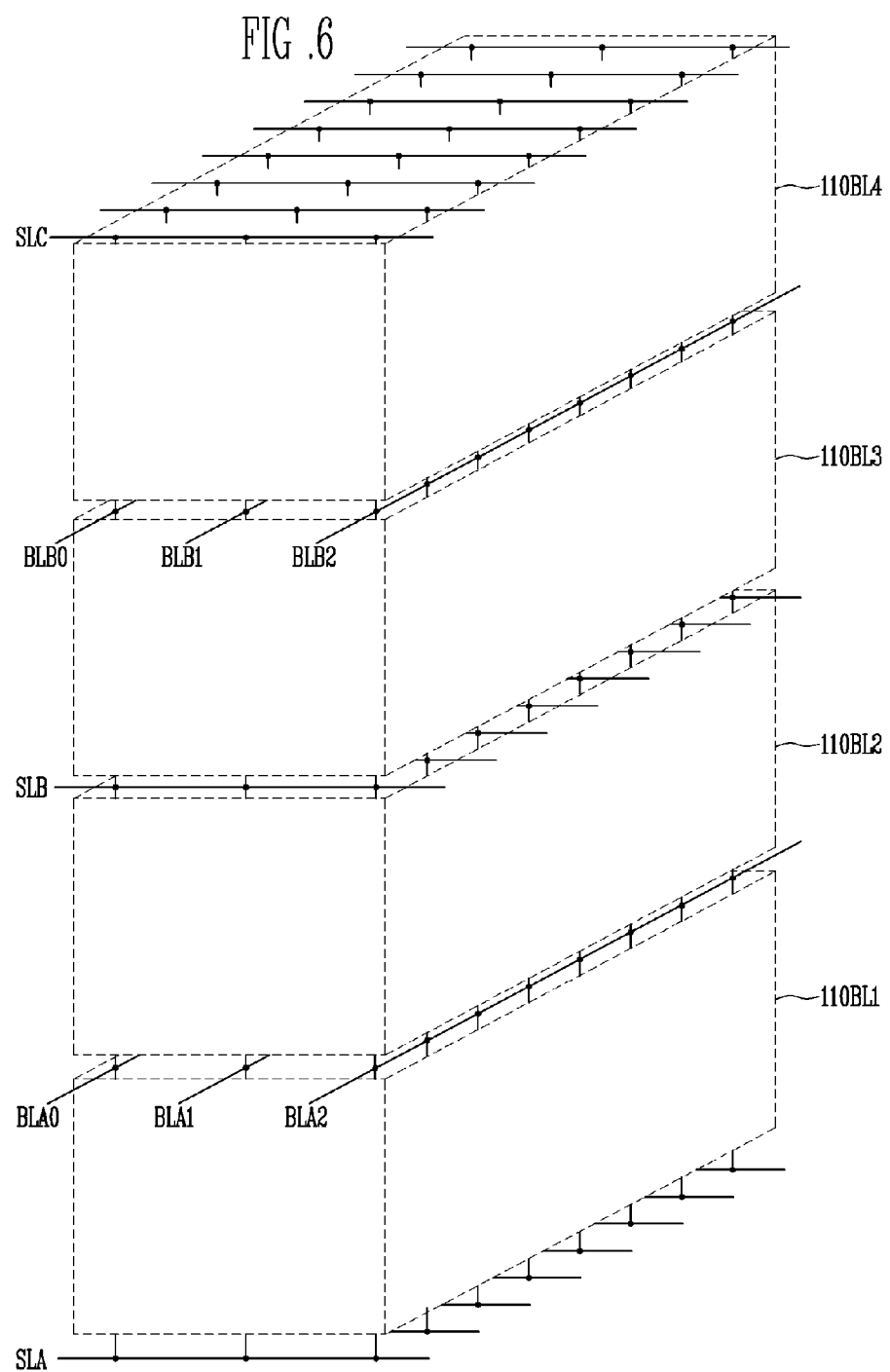
FIG. 6 is a block diagram of the memory array of FIG. 1.

FIG. 6 is a block diagram of the memory array of FIG. 1.

Referring to FIG. 6, at least two of the memory block layers described with reference to FIG. 5 may be stacked. Memory blocks (or memory strings) included in odd-numbered memory block layers 110BL1 and 110BL3 and memory blocks (or memory strings) included in even-numbered memory block layers 110BL2 and 110BL4 may share bit lines BLA0 to BLA2 or common source lines SLA, SLB, and SLC.

More specifically, the odd-numbered memory block layer 110BL3 may share the bit lines BLB0 to BLB2 with the even-numbered memory block layer 110BL4 stacked thereabove and may share the common source line SLB with the even-numbered memory block layer 110BL2 stacked therebelow. On the other hand, an even-numbered memory block layer may share bit lines with an odd-numbered memory block layer stacked thereabove and may share a common source line with an odd-numbered memory block layer stacked therebelow. To this end, the bit lines BLA0 to BLA2 and the bit lines BLB0 to BLB2 may be formed at different layers, and the common source lines SLA to SLC may be formed at different layers.

Figure 7:
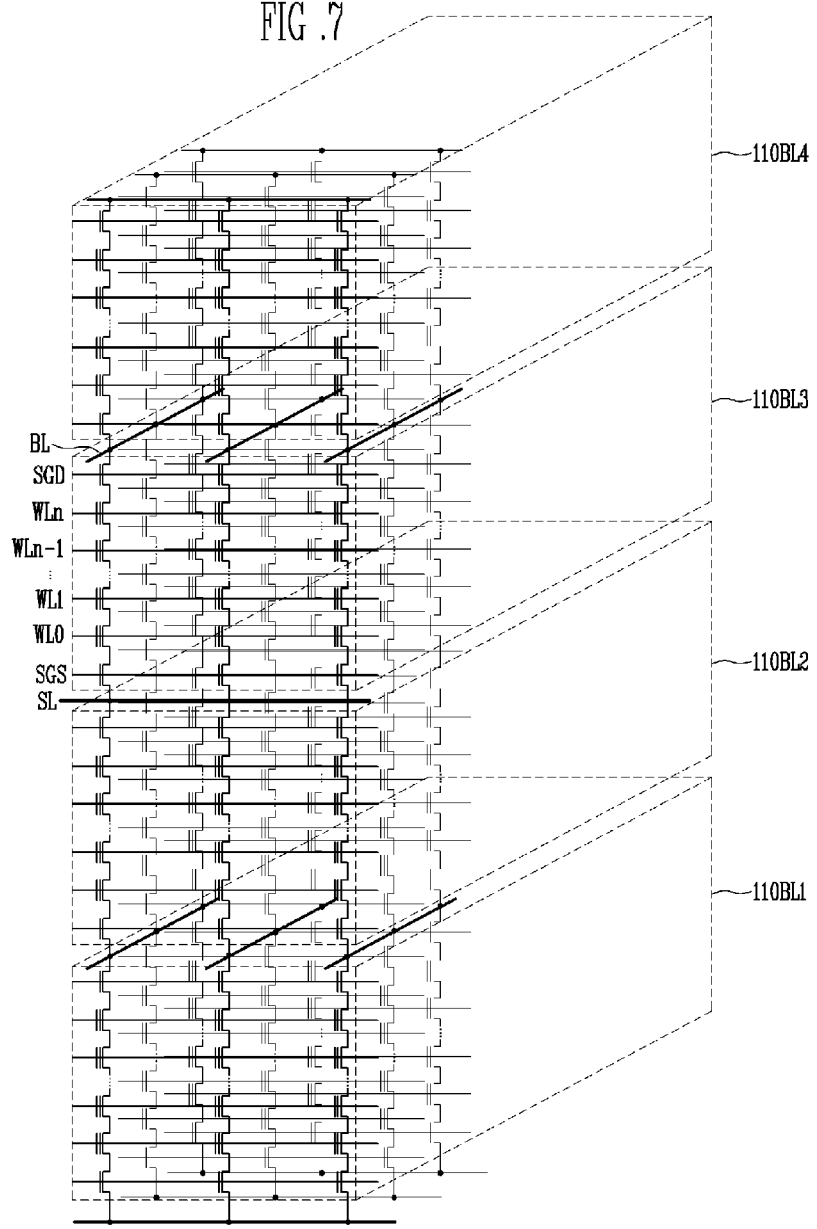
FIG. 7 is a circuit diagram of the memory array of FIG. 1.

FIG. 7 shows that each memory block layer, for example, the memory block layer 110BL3, may include a plurality of memory blocks. Each memory block may include a plurality of memory strings ST. Memory strings that are included in different memory block layers and share the bit line BL may have symmetrical shapes. In other words, a memory string (or memory block) disposed on an even-numbered layer and a memory string (or memory block) disposed on an odd-numbered memory string may be stacked into a symmetrical structure. In substantially the same manner, memory strings that are included in different memory block layers and share the common source line SL may be stacked into a symmetrical structure.

Vertically adjacent memory blocks (or memory strings) may share the word lines WL0 to WLn, while horizontally adjacent memory blocks may have word lines separated from each other. In other words, word lines of memory blocks included in the same memory block layer may be separated from each other. The word lines WL0 to WLn of the memory blocks (or memory strings) stacked within the same area may be coupled to each other.

Memory strings included in the same memory block may be coupled in common to the common source line SL, and common source lines of memory blocks arranged in the same memory block layer may be separated from each other. In other words, the memory blocks arranged in the same layer may be coupled to different common source lines.

In the same memory block, gate lines (or drain selection lines) SGD of drain selection transistors of the memory strings that share the bit line BL may be separated from each other. In addition, in the same memory block, gate lines (or source selection lines) SGS of source selection transistors of the memory strings that share the common source line SL may be coupled to each other.

Referring again to FIGS. 1 and 7, the operation control circuit 120 may be configured to control a data input/output operation including a read operation of memory cells included in a selected memory block. The operation control circuit 120 may output a voltage control signal CMD_OPV to an operating voltage supply circuit 130 in order to control the generation of voltages (e.g., Vsgd, Vread, Vpass_read, Vpgm, Vpass_pgm, Vsgs and Vsl) necessary for the data input/output operation in response to a command signal CMD being applied. In addition, the operation control circuit 120 may output an operation control signal CMD_RW to a read/write circuit 150 in order to control operations of a circuit (e.g., page buffer) included in the read/write circuit 150 in response to an operation selected from among a read operation, a program operation and an erase operation.

The operation control circuit 120 may output a bit line selection signal BL_SEL to a bit line control circuit 140 in order to select a group of bit lines among bit line groups (BLA0 to BLAk and BLB0 to BLBk) formed at different layers in response to an address signal ADD being applied. In addition, the operation control circuit 120 may output a bit line voltage control signal CMD_VBL to the bit line control circuit 140 in order to control the generation of voltages to be supplied to unselected bit lines.

The operation circuits 130 to 150, controlled by the operation control circuit 120, may be configured to supply operating voltages to memory blocks for a data input/output operation of a selected memory string ST. Additionally, the operation circuits 130 to 150 may turn on semiconductor devices (e.g., selection transistors and memory cells) of an underlying or overlying unselected memory string that shares the common source line SL with the selected memory string ST during a read operation of the selected memory string ST. In other words, a current path may be additionally provided from the common source line SL to a bit line of the underlying or overlying unselected memory string through the unselected memory string during the read operation of the selected memory string ST. A detailed description thereof will be made below.

These operation circuits may include the operating voltage supply circuit 130, the bit line control circuit 140 and the read/write circuit 150.

The power supply circuit 130 may output the operating voltages (e.g., Vsgd, Vread, Vpass_read, Vpgm, Vpass_pgm, Vsgs, Vsl, etc.) used for the data input/output operation of the memory cells to the memory blocks in response to the voltage control signal CMD_OPV from the operation control circuit 120.

The read/write circuit 150 may be coupled to the memory array 110 through the bit lines BLA0 to BLAk or BLB0 to BLBk. The read/write circuit 150 may selectively precharge the bit lines according to data to be stored in the memory cells or may latch data stored in the memory cells by sensing changes in voltages (or currents) of the bit lines in response to the operation control signal CMD_RW from the operation control circuit 120.

The bit line control circuit 140 may be configured to couple a bit line of the selected memory string to the read/write circuit 150 and supply a ground voltage to the bit line of the underlying or overlying unselected memory string that shares the common source line SL with the selected memory string during the read operation. Here, all of the semiconductor devices (e.g., select transistors and memory cells) included in the unselected memory string may be turned on by the operating voltage supply circuit 130. As a result, when all semiconductor devices included in the selected memory string and the unselected memory string are turned on, a first current path may be formed between the bit line BL of the selected memory string ST and the common source line SL, and a second current path may be formed between the bit line BL of the selected memory string ST and the bit line of the unselected memory string. A detailed description thereof is set forth below.

The bit line control circuit 140 may include a bit line voltage supply circuit 141 and a bit line switching circuit 143. The bit line voltage supply circuit 141 may supply a ground voltage or a precharge voltage to the bit line of the unselected memory string in response to the bit line voltage control signal CMD_VBL during a program operation and may supply an erase voltage to the bit line of the unselected memory string during an erase operation. In response to the bit line selection signal BL_SEL, the bit line switching circuit 143 may couple bit lines (e.g., BLA0 to BLAk) of selected memory strings to the read/write circuit 150 and may transfer the ground voltage (e.g., 0V), the precharge voltage (e.g., Vcc) or the erase voltage Verase, which is generated by the bit line voltage supply circuit 141, to bit lines (e.g., BLB0 to BLBk) of unselected memory strings.

Hereinafter, operations of the semiconductor memory device including the above-described components will be described.

Figure 8:
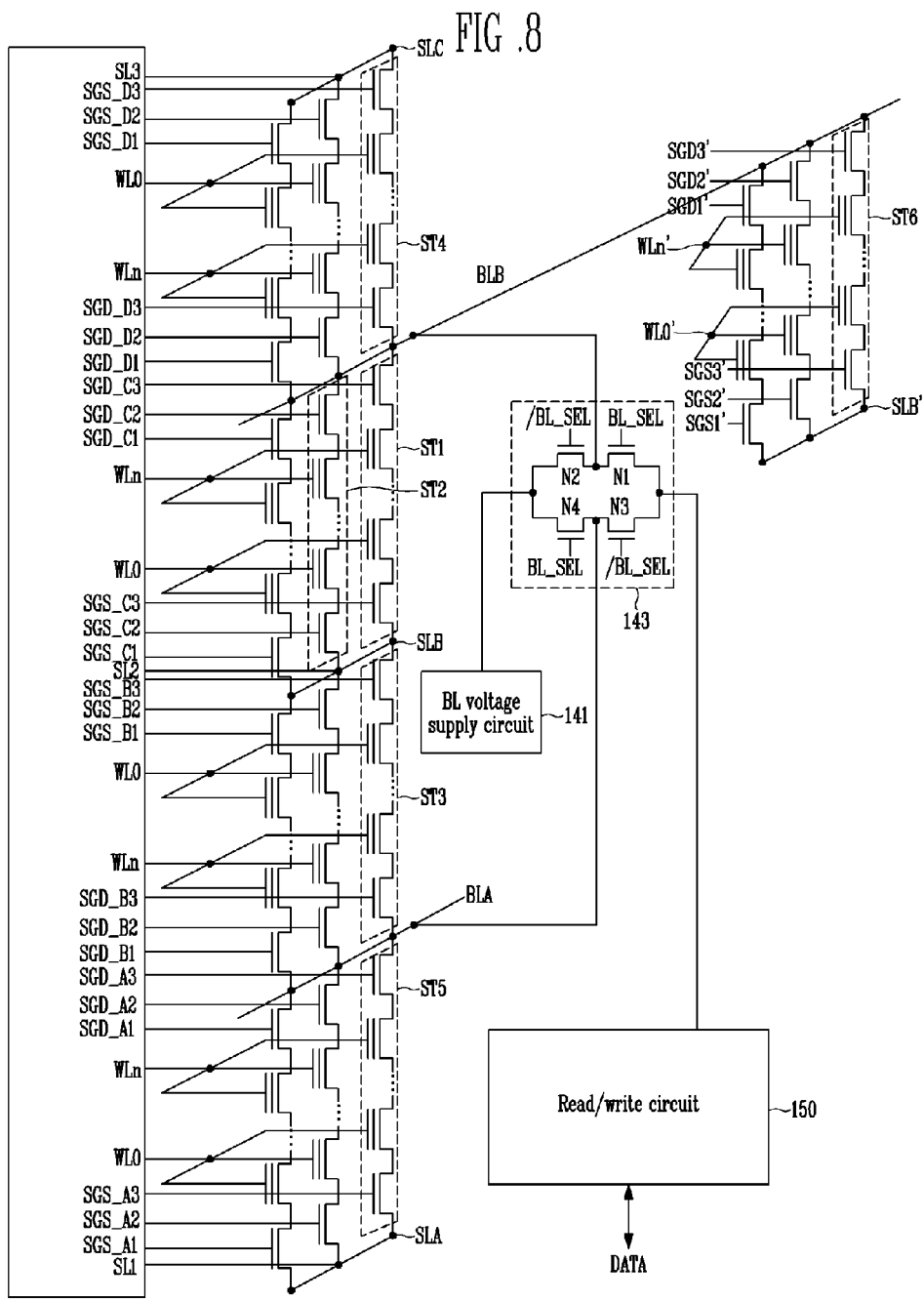
FIG. 8 is a circuit diagram of a semiconductor memory device according to an embodiment of the present invention.
Figure 9:
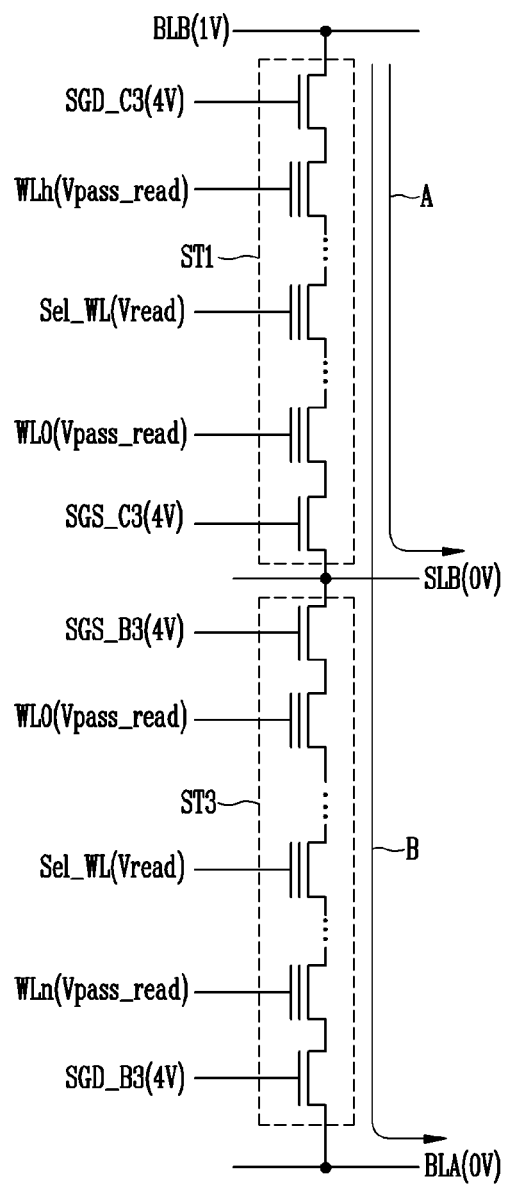
FIG. 9 is a circuit diagram of current paths formed by a common source line and bit lines of FIG. 8.

FIG. 8 is a circuit diagram of a semiconductor memory device according to an embodiment of the present invention. FIG. 9 is a circuit diagram of current paths formed by a common source line and bit lines of FIG. 8.

FIG. 8 illustrates that first to sixth strings ST1 to ST6 are included in first to fourth memory block layers. The first memory string ST1 may refer to a selected memory string among strings included in a selected memory block of a third memory block layer.

The second memory string ST2 may refer to a memory string that shares a bit line BLB, a common source line SLB and word lines WL0 to WLn with the first memory string ST1 in the selected memory block of the third memory block layer. The first memory string ST1 and the second memory string ST2 may have source selection lines SGS_C3 and SGS_C2 coupled to each other and drain selection lines SGD_C3 and SGD_C2 separated from each other.

The third memory string ST3 may refer to a memory string included in a memory block sharing the common source line SLB with the selected memory block of the third memory block layer, among memory blocks of the second memory block layer. In other words, the third memory string ST3 may share the common source line SLB with the first memory string ST1 and be adjacent to the bottom thereof. Since memory blocks of the second memory block layer share the word lines WL0 to WLn with those of a memory block layer vertically adjacent to the second memory block layer, the third memory string ST3 may share the word lines WL0 to WLn with the first memory string ST1.

The fourth memory string ST4 may refer to a memory string included in a memory block that shares the bit line BLB with the selected memory block of the third memory block layer, among memory blocks of the fourth memory block layer. In other words, the fourth memory string ST4 may share the bit line BLB with the first memory string ST1 and be adjacent to the top thereof. Since the memory blocks of the fourth memory block layer share the word lines WL0 to WLn with those of a memory block layer vertically adjacent to the fourth memory block layer, the fourth memory string ST4 may share the word lines WL0 to WLn with the first memory string ST1.

The fifth memory string ST5 may refer to a memory string included in a memory block that shares a bit line BLA with a selected memory block of the second memory block layer, among memory blocks of the first memory block layer. The fifth memory string ST5 may share the bit line BLA with the third memory string ST3 and be adjacent to the bottom thereof. Since the memory blocks of the second memory block layer share the word lines WL0 to WLn with those of a memory block layer vertically adjacent to the second memory block layer, the fifth memory string ST5 may share the word lines WL0 to WLn with the first memory string ST1.

The sixth memory string ST6 may refer to a memory string included in an unselected memory block of the third memory block layer. The sixth memory string ST6 may share the bit line BLB with the first memory string ST1 and have a common source line SLB' and word lines WL0' to WLn' separated from the common source line SLB and the word lines WL0 to WLn of the first memory string ST1, respectively.

The bit lines BLA and BLB may be formed at different layers, and the common source lines SLA, SLB and SLC may be formed at different layers between the bit lines BLA and BLB. The bit lines BLA and BLB and the common source lines SLA, SLB and SLC may be arranged in directions crossing each other.

The power supply circuit 130 (shown in FIG. 1) may supply the voltages for the data input and output operation to the common source lines SLA, SLB and SLC, source selection lines SGS_A1, SGS_A2, SGS_A3, SGS_B1, SGS_B2, SGS_B3, SGS_C1, SGS_C2, SGS_C3, SGS_D1, SGS_D2 and SGS_D3, the word lines WL0 to WLn, and drain selection lines SGD_A1, SGD_A2, SGD_A3, SGD_B1, SGD_B2, SGD_B3, SGD_C1, SGD_C2, SGD_C3, SGD_D1, SGD_D2 and SGD_D3 of the memory blocks (or memory strings) as shown in Table 1 below.

TABLE 1

|  |  |  | Read | Program | Erase |  |  | Read | Program | Erase |
|---|---|---|---|---|---|---|---|---|---|---|
| $4^{th}$ layer memory block (sharing BL & WL with ST1) | memory string(ST4) | BLB | 1 V | Vcc->0 V/Vcc | Floating | $4^{th}$ layer memory block (sharing BL with ST1) | BLB | 1 V | Vcc->0 V/Vcc | Floating |
|  |  | SGD_D3 | 0 V | 5 V->0 V or −2 V | 0 V |  | SGD_D3 | 0 V | 0 V or −2 V | 0 V |
|  |  | WLn | Vpass_read | Vpass_pgm | −10 V |  | WLn' | 0 V | 0 V | 0 V |
|  |  | ... | ... | ... | ... |  | ... | ... | ... | ... |
|  |  | WL | Vread | Vpgm | −10 V |  | WL' | 0 V | 0 V | 0 V |
|  |  | ... | ... | ... | ... |  | ... | ... | ... | ... |
|  |  | WL0 | Vpass_read | Vpass_pgm | −10 V |  | WL0 | 0 V | 0 V | 0 V |
|  |  | SGS_D3 | 4 V | 0 V or −2 V | 0 V or −2 V |  | SGS_D3 | 0 V | 0 V | 0 V |
|  |  | SLC | Vcc | Vcc | 0 V |  | SLC' | 0 V | 0 V | 0 V |
| $3^{rd}$ layer memory block (selected) | memory string(ST1) | BLB | 1 V | 5 V->0 V or −2 V | Floating | $3^{rd}$ layer memory block (memory string ST6 sharing BL with ST1) | BLB | 1 V | Vcc->0 V/Vcc | Floating |
|  |  | SGD_C3 | 4 V | 5 V->1.5 V | 0 V |  | SGD_C3 | 0 V | 0 V or −2 V | 0 V |
|  |  | WLn | Vpass_read | Vpass_pgm | −10 V |  | WLn' | 0 V | 0 V | 0 V |
|  |  | ... | ... | ... | ... |  | ... | ... | ... | ... |
|  |  | SEL_WL | Vread | Vpgm | −10 V |  | WL' | 0 V | 0 V | 0 V |
|  |  | ... | ... | ... | ... |  | ... | ... | ... | ... |
|  |  | WL0 | Vpass_read | Vpass_pgm | −10 V |  | WL0' | 0 V | 0 V | 0 V |
|  |  | SGS_C3 | 4 V | 0 V or −2 V | Verase(8 V) |  | SGS_C3 | 0 V | 0 V | 0 V |
|  |  | SLB | 0 V | Vcc | Verase(8 V) |  | SLB' | 0 V | 0 V | 0 V |
| $2^{nd}$ layer memory block (sharing SL & WL with ST1) | memory string(ST3) | BLA | 0 V | Vcc | Floating | $2^{nd}$ layer memory block | BLA | Vcc | Vcc | Floating |
|  |  | SGD_B3 | 4 V | 5 V->0 V or −2 V | 0 V |  | SGD_B3 | 0 V | 0 V or −2 V | 0 V |
|  |  | WLn | Vpass_read | Vpass_pgm | −10 V |  | WLn' | 0 V | 0 V | 0 V |
|  |  | ... | ... | ... | ... |  | ... | ... | ... | ... |
|  |  | WL | Vread | Vpgm | −10 V |  | WL' | 0 V | 0 V | 0 V |
|  |  | ... | ... | ... | ... |  | ... | ... | ... | ... |
|  |  | WL0 | Vpass_read | Vpass_pgm | −10 V |  | WL0' | 0 V | 0 V | 0 V |
|  |  | SGS_B3 | 4 V | 0 V or −2 V | 0 V or −2 V |  | SGS_B3 | 0 V | 0 V | 0 V |
|  |  | SLB | 0 V | Vcc | Verase(8 V) |  | SLB' | 0 V | 0 V | 0 V |
| $1^{st}$ layer memory block (sharing WL with ST1) | memory string(ST5) | BLA | 0 V | Vcc | Floating | $1^{st}$ layer memory block | BLA | Vcc | Vcc | Floating |
|  |  | SGD_A3 | 0 V | 5 V->0 V or −2 V | 0 V |  | SGD_A3 | 0 V | 0 V or −2 V | 0 V |
|  |  | WLn | Vpass_read | Vpass_pgm | −10 V |  | WLn' | 0 V | 0 V | 0 V |
|  |  | ... | ... | ... | ... |  | ... | ... | ... | ... |
|  |  | WL | Vread | Vpgm | −10 V |  | WL' | 0 V | 0 V | 0 V |
|  |  | ... | ... | ... | ... |  | ... | ... | ... | ... |
|  |  | WL0 | Vpass_read | Vpass_pgm | −10 V |  | WL0' | 0 V | 0 V | 0 V |
|  |  | SGS_A3 | 4 V | 0 V or −2 V | 0 V or −2 V |  | SGS_A3 | 0 V | 0 V | 0 V |
|  |  | SLA | Vcc | Vcc | 0 v |  | SLA' | 0 V | 0 V | 0 V |

For reference, voltages may be supplied to the second memory string ST2 as shown in Table 2 below.

TABLE 2

| | | | Read | Program | Erase |
|---|---|---|---|---|---|
| 3$^{rd}$ layer memory block (sharing BL & SL & WL with ST1) | memory string(ST2) | BLB | 1 V | 5 V->0 V or −2 V | Floating |
| | | SGD_C2 | 4 V | 5 V->1.5 V | 0 V |
| | | WLn | Vpass_read | Vpass_pgm | −10 V |
| | | ... | ... | ... | ... |
| | | SEL_WL | Vread | Vpgm | −10 V |
| | | ... | ... | ... | ... |
| | | WL0 | Vpass_read | Vpass_pgm | −10 V |
| | | SGS_C2 | 4 V | 0 V or −2 V | Verase(8 V) |
| | | SLB | 0 V | Vcc | Verase(8 V) |

The bit line switching circuit 143 that operates in response to the bit line selection signal BL_SEL may be coupled to the bit lines BLA and BLB. When the bit line BLB is selected during a read operation, the bit line BLB may be coupled to the read/write circuit 150 by a transistor N1 of the bit line switching circuit 143, and the ground voltage (e.g., 0V) generated by the bit line voltage supply circuit 141 may be transferred to the unselected bit line BLA through a transistor N4 of the bit line switching circuit 143.

As for voltages supplied during the read operation in accordance with voltage applying conditions as shown in Table 1 above, a read voltage Vread may be supplied to a selected word line among the word lines WL0 to WLn of the memory strings ST1, ST3, ST4 and ST5, and a read pass voltage Vpass_read may be supplied to unselected word lines in order to turn on the memory cell. The precharge voltage (e.g., 1V) may be supplied to the bit line BLB of the selected memory string ST1 by the read/write circuit 150. The ground voltage (0V) may be supplied to the common source line SLB by the power supply circuit 130 (FIG. 1). In addition, a voltage of, for example, 4V may be supplied to the selection lines SGS_C3 and SGD_C3 of the selected memory string ST1 in order to turn on select transistors.

When the memory cell coupled to the selected word line is turned on by the read voltage Vread, as illustrated in FIG. 9, a first current path A may be formed from the bit line BLB to the common source line SLB through the memory string ST1.

Substantially the same operating voltages as the operating voltages supplied to the selected memory string ST1 may be supplied to the third memory string ST3 that shares the common source line SLB with the selected memory string ST1 and is adjacent to the bottom thereof. For example, the read voltage Vread may be supplied to a selected word line among the word lines WL0 to WLn of the third memory string ST3, while the read pass voltage Vpass_read may be supplied to unselected word lines in order to turn on the memory cells. The ground voltage generated by the bit line voltage supply circuit 141 may be supplied to the bit line BLA of the third memory string ST3 by the transistor N4 of the bit line switching circuit 143, and the ground voltage 0V may be supplied to the common source line SLB by the power supply circuit 130. In addition, a voltage of, for example, 4V may be supplied to the selection lines SGS_B3 and SGD_B3 of the third memory string ST3 to turn on select transistors.

When all of the semiconductor devices (e.g., memory cells and select transistors) included in the third memory string ST3 are turned on by the read voltage Vread and the read pass voltage Vpass_read, as illustrated in FIG. 9, a second current path B may be additionally formed from the common source line SLB to the bit line BLA through the third memory string ST3. In other words, the second current path B may be additionally formed from the bit line BLB of the selected memory string ST1 to the bit line BLA of the third memory string ST3.

Malfunction or the deterioration of operational reliability which results from a current path affected by the resistance of the common source line SLB during the read operation of the memory string ST1 may be prevented since another current path is also formed.

Figure 10:
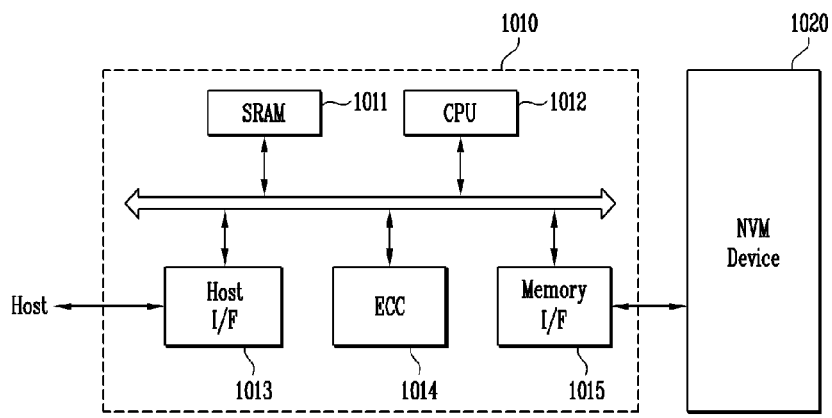
FIG. 10 is a schematic block diagram of a memory system according to an embodiment of the present invention.

As illustrated in FIG. 10, a memory system 1000 according to an embodiment of the present invention may include a non-volatile memory device 1020 and a memory controller 1010.

The non-volatile memory device 1020 may have the above-described semiconductor memory device. The memory controller 1010 may be configured to control the non-volatile memory device 1020 in a general operation mode such as a program loop, a read operation or an erase loop.

The memory system 1000 may be a solid state disk (SSD) or a memory card in which the memory device 1020 and the memory controller 1010 are combined. SRAM 1011 may function as an operation memory of a processing unit (CPU) 1012. A host interface 1013 may include a data exchange protocol of a host being coupled to the memory system 1000. An error correction code (ECC) block 1014 may detect and correct errors included in a data read from the non-volatile memory device 1020. A memory interface (I/F) 1015 may interface with the non-volatile memory device 1020. The CPU 1012 may perform the general control operation for data exchange of the memory controller 1010.

Though not illustrated in FIG. 10, the memory system 1000 may further include ROM (not illustrated) that stores code data to interface with the host. In addition, the non-volatile memory device 1020 may be a multi-chip package composed of a plurality of flash memory chips. The memory system 1000 may be provided as a storage medium with a low error rate and high reliability. A memory system such as a Solid State Disk (SSD), on which research has been actively carried out, may include a flash memory device according to an embodiment of the present invention. In this case, the memory controller 1010 may be configured to communicate with the outside (e.g., a host) through one of the interface protocols including USB, MMC, PCI-E, SATA, PATA, SCSI, ESDI and IDE.

Figure 11:
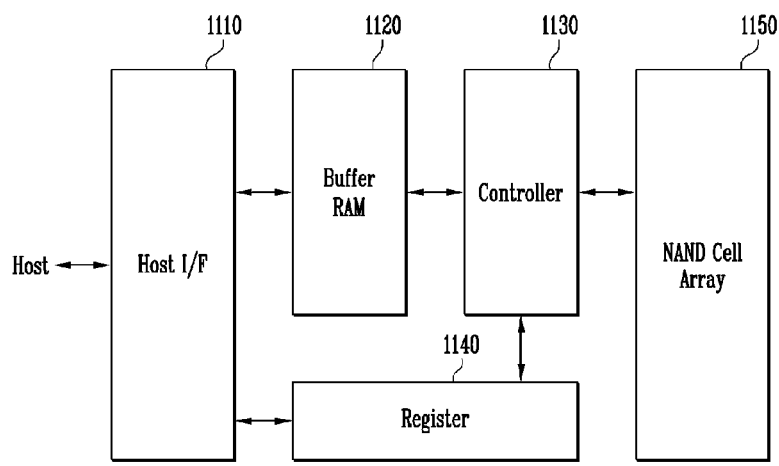
FIG. 11 is a schematic block diagram of a fusion memory device or a fusion memory system configured to perform a program operation according to the aforementioned various embodiments.

FIG. 11 is a schematic block diagram of a fusion memory device or a fusion memory system configured to perform a program operation according to the aforementioned various embodiments. For example, the technical features of the present invention may be used in a OneNAND flash memory device 1100 as a fusion memory device.

The OneNAND flash memory device 1100 may include a host interface (I/F) 1110, a buffer RAM 1120, a controller 1130, a register 1140 and a NAND flash cell array 1150. The host interface 1110 may be configured to exchange various types of information with a device through a different protocol. The buffer RAM 1120 may have built-in codes for driving the memory device or temporarily storing data. The controller 1130 may be configured to control read and program operations and every state in response to a control signal and a command provided by an external device. The register 1140 may be configured to store data including instructions, addresses and configurations defining a system operating environment in the memory device. The NAND flash cell array 1150 may be formed of operation circuits including non-volatile memory cells and page buffers. The memory array, as illustrated in FIG. 2, may be used as the memory array of the NAND flash cell array 1150.

Figure 12:
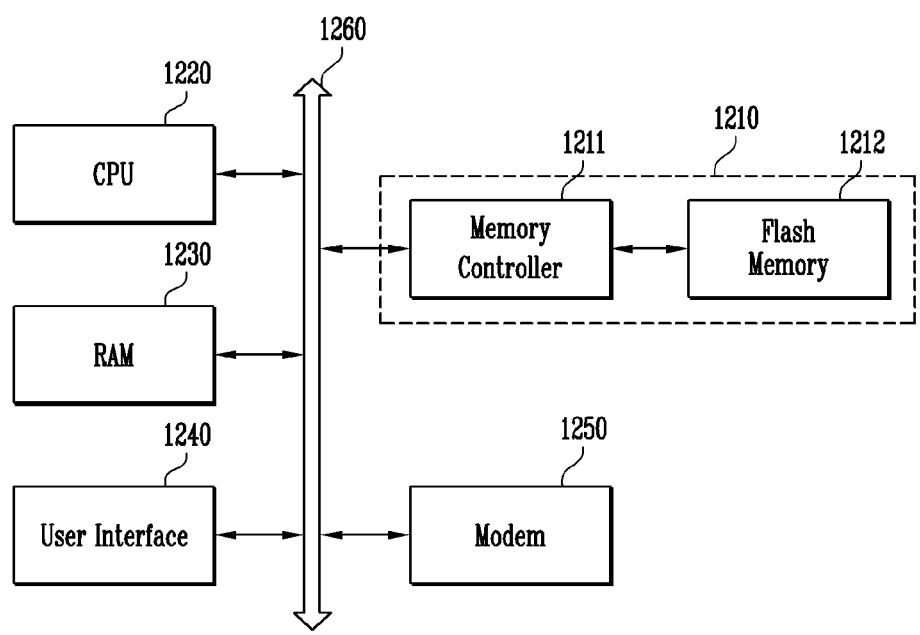
FIG. 12 is a schematic block diagram of a computing system including a flash memory device according to an embodiment of the present invention.

FIG. 12 is a schematic view of a computing system including a flash memory device 1212 according to an embodiment of the present invention.

A computing system 1200 according to an embodiment of the present invention may include a microprocessor (CPU) 1220, RAM 1230, a user interface 1240, a modem 1250, such as a baseband chipset, and a memory system 1210 that are electrically coupled to a system bus 1260. In addition, if the computing system 1200 is a mobile device, then a battery (not illustrated) may be additionally provided to apply operating voltage to the computing system 1200. Though not illustrated in FIG. 12, the computing system 1200 may further include application chipsets, a Camera Image Processor (CIS), or mobile DRAM. The memory system 1210 may form a Solid State Drive/Disk (SSD) that uses a non-volatile memory to store data. The memory system 1210 may be provided as a fusion flash memory (e.g., OneNAND flash memory).

What is claimed is:

1. A semiconductor memory device, comprising:
a memory array including memory blocks stacked in a plurality of layers over a substrate, wherein memory strings included in memory blocks of an odd-numbered layer and memory strings included in memory blocks of an even-numbered layer share bit lines or a common source line; and
an operation circuit configured to supply operating voltages to the memory blocks for a data input/output operation of a selected memory string,
wherein the operation circuit is configured to turn on semiconductor devices of an unselected memory string located above or below the selected memory string and sharing the common source line with the selected memory string during a read operation of the selected memory string.

2. The semiconductor memory device of claim 1, wherein the memory blocks arranged in the even-numbered layer and the memory blocks arranged in the odd-numbered layer are stacked in a symmetrical structure.

3. The semiconductor memory device of claim 1, wherein the memory blocks arranged in the odd-numbered layer share the bit lines with memory blocks arranged in an upper even-numbered layer and share the common source line with memory blocks arranged in a lower even-numbered layer.

4. The semiconductor memory device of claim 1, wherein vertically adjacent memory blocks share word lines, while horizontally adjacent memory blocks have word lines separated from each other.

5. The semiconductor memory device of claim 1, wherein memory strings in each memory block are coupled in common to the common source line, and memory strings included in different memory blocks in the same layer are coupled to different common source lines.

6. The semiconductor memory device of claim 1, wherein each of the memory strings includes a first selection transistor coupled to the common source line, a second selection transistor coupled to each of the bit lines, and memory cells vertically coupled in series between the first and second selection transistors.

7. The semiconductor memory device of claim 6, wherein first selection transistors of memory strings in each memory block are operated at substantially the same operating voltage.

8. The semiconductor memory device of claim 6, wherein second selection transistors of memory strings in each memory block are independently operated at different operating voltages.

9. The semiconductor memory device of claim 1, wherein the operation circuit comprises:
a read/write circuit configured to read data stored in a memory cell of the selected memory string; and
a bit line control circuit configured to supply a ground voltage to a bit line of the unselected memory string and couple a bit line of the selected memory string to the read/write circuit.

10. The semiconductor memory device of claim 9, wherein the bit line control circuit comprises:
a bit line voltage supply circuit configured to supply a ground voltage or a precharge voltage to the bit line of the unselected memory string during a program operation and supply an erase voltage to the bit line of the unselected memory string during an erase operation; and
a bit line switching circuit configured to couple the bit line of the selected memory string to the read/write circuit and transfer the ground voltage, the precharge voltage or the erase voltage to the bit line of the unselected memory string.

11. A semiconductor memory device, comprising:
stacked memory strings in which at least some adjacent memory strings share bit lines or a common source line; and
a current path provided from the common source line to a bit line of an unselected memory string during a read operation of a selected memory string.

12. The semiconductor memory device of claim 11, wherein the stacked memory strings further comprise memory strings arranged vertically and horizontally over a substrate.

13. The semiconductor memory device of claim 12, wherein memory strings in an odd-numbered layer and memory strings in an even-numbered layer share bit lines or a common source line.

14. The semiconductor memory device of claim 13, wherein the current path is provided from the common source line to a bit line of an unselected memory string located above or below a selected memory string through the unselected memory string during a read operation of the selected memory string.

15. The semiconductor memory device of claim 11, wherein memory strings arranged in an odd-numbered layer share bit lines with memory strings arranged in an upper even-numbered layer and share a common source line with memory strings arranged in a lower even-numbered layer.

16. The semiconductor memory device of claim 11, wherein a precharge voltage is supplied to a bit line of the selected memory string, and a ground voltage is supplied to the bit line of the unselected memory string.

17. The semiconductor memory device of claim 11, wherein a ground voltage is supplied to a common source line of the memory strings during the read operation.

18. The semiconductor memory device of claim 11, wherein semiconductor devices included in the unselected memory string are all turned on in order to provide the current path.

19. The semiconductor memory device of claim 11, wherein substantially the same operating voltage is supplied to the selected memory string and the unselected memory string.

20. The semiconductor memory device of claim 11, wherein when semiconductor devices of the selected memory string are all turned on during the read operation, a first current path is formed from a bit line of the selected memory string to a common source line, and a second current path is formed from the bit line of the selected memory string to a bit line of the unselected memory string.

* * * * *